(12) United States Patent
Heiss et al.

(10) Patent No.: US 11,730,068 B2
(45) Date of Patent: Aug. 15, 2023

(54) PHASE CHANGE SWITCH WITH SELF-ALIGNED HEATER AND RF TERMINALS

(71) Applicant: Infineon Technologies AG, Neubiberg (DE)

(72) Inventors: Dominik Heiss, Munich (DE); Christoph Kadow, Gauting (DE); Matthias Markert, Weinboehla (DE)

(73) Assignee: Infineon Technologies AG, Neubiberg (DE)

( * ) Notice: Subject to any disclaimer, the term of this patent is extended or adjusted under 35 U.S.C. 154(b) by 218 days.

(21) Appl. No.: 17/350,398

(22) Filed: Jun. 17, 2021

(65) Prior Publication Data
US 2022/0407004 A1    Dec. 22, 2022

(51) Int. Cl.
*H10N 70/00* (2023.01)
*H01L 23/66* (2006.01)
*H10N 70/20* (2023.01)

(52) U.S. Cl.
CPC ........... *H10N 70/011* (2023.02); *H01L 23/66* (2013.01); *H10N 70/231* (2023.02); *H10N 70/823* (2023.02); *H10N 70/8413* (2023.02); *H10N 70/8828* (2023.02)

(58) Field of Classification Search
CPC ..... H10N 70/011; H10N 70/231; H01L 23/66
See application file for complete search history.

(56) References Cited

U.S. PATENT DOCUMENTS

2019/0088721 A1    3/2019    Reig et al.
2021/0050518 A1    2/2021    Gong et al.

FOREIGN PATENT DOCUMENTS

WO    2020132037 A1    6/2020

OTHER PUBLICATIONS

Heiss, Dominik, et al., "Phase Change Switch with Multi Face Heater Configuration", U.S. Appl. No. 16/844,450, filed Apr. 9, 2020, 1-38.
Singh, Tejinder, et al., "Chalcogenide Phase Change Material GeTe Based Inline RF SPST Series and Shunt Switches", IEEE MTT-S International Microwave Workshop Series on Advanced Materials and Processes for RF and THz Applications (IMWS-AMP 2018), Ann Arbor, MI, USA, Jul. 16-18, 2018, pp. 1-4.

*Primary Examiner* — Marvin Payen
(74) *Attorney, Agent, or Firm* — Murphy, Bilak & Homilier, PLLC (57) ABSTRACT

A method of forming a phase change switching device includes providing a substrate, forming first and second RF terminals on the substrate, forming a strip of phase change material on the substrate that is connected between the first and second RF terminals, forming a heating element adjacent to the strip of phase change material such that the heating element is configured to control a conductive state of the strip of phase change material. The first and second RF terminals and the heating element are formed by a lithography process that self-aligns the heating element with the first and second RF terminals.

20 Claims, 8 Drawing Sheets

PHASE CHANGE SWITCH WITH SELF-ALIGNED HEATER AND RF TERMINALS

BACKGROUND

Modern electronics applications require switching devices capable of accommodating very high frequency signals. For example, fifth generation wireless applications (5G) will operate in frequency bands of 24.25 GHz (gigahertz) or greater. Maintaining the correct ON/OFF ratio/isolation versus insertion loss/$R_{ON}$ (on-resistance) and $C_{OFF}$ (off-capacitance) is difficult or impossible to achieve in current semiconductor switching technologies, such as CMOS technology. Phase change switches represent one promising alternative technology that can meet the requirements for high frequency applications. A phase change switch utilizes a phase change material to control a conductive connection between two terminals. The switching operation is performed by transitioning the phase change material between states, e.g., through the application of heat to the phase change material. While promising, phase change switches are in the early stages of development and some design challenges are yet to be resolved. For example, this device concept is sensitive to variation in device parameters such as $R_{ON}$ (on-resistance) $C_{OFF}$ (off-capacitance), power consumption, linearity, etc., due to minor variations in the physical features of the device associated with manufacturing process variation. Accordingly, there is a need improve upon the manufacturing techniques used to form phase change switches.

SUMMARY

A method of forming a phase change switching device is disclosed. According to an embodiment, the method comprises providing a substrate, forming first and second RF terminals on the substrate, forming a strip of phase change material on the substrate that is connected between the first and second RF terminals, forming a heating element adjacent to the strip of phase change material such that the heating element is configured to control a conductive state of the strip of phase change material, wherein the first and second RF terminals and the heating element are formed by a lithography process that self-aligns the heating element with the first and second RF terminals.

Separately or in combination, the method further comprises forming a region of electrically insulating material on the substrate, and forming a first trench and a second trench in the region of electrically insulating material by the lithography process, wherein the first and second RF terminals are formed in the first and second trenches, respectively.

Separately or in combination, the method further comprises forming a third trench in the region of electrically insulating material by the lithography process, and wherein the heating element is formed in the third trench.

Separately or in combination, the first, second and third trenches are each formed simultaneously by a single masked etching step.

Separately or in combination, the first and second RF terminals are formed in the first and second trenches, respectively, before forming the third trench, and wherein forming the third trench comprises using the first and second RF terminals as an etch mask.

Separately or in combination, the heating element has a different metal composition as the first and second RF terminals.

Separately or in combination, the heating element is disposed below the strip of phase change material.

Separately or in combination, the heating element is disposed above the strip of phase change material.

According to another embodiment, the method comprises forming a region of electrically insulating material on the substrate, depositing a first metal layer on the region of electrically insulating material, structuring the first metal layer to form first, second and third laterally isolated sections of the first metal layer; and configuring the first, second and third laterally isolated sections of the first metal layer such that the first and second laterally isolated sections are first and second RF terminals of the phase change switching device, respectively, and such that the third laterally isolated section is a heating element of the phase change switching device.

Separately or in combination, structuring the first metal layer comprises forming first, second and third trenches in the region of electrically insulating material, depositing the first metal layer on the region of electrically insulating material to fill the first, second and third trenches; and planarizing an upper surface of the first metal layer so as to form the first, second and third laterally isolated sections of the first metal layer, wherein the first, second and third trenches are formed by a lithography process that self-aligns the third trench with the first and second trenches.

Separately or in combination, forming first, second and third trenches comprises performing a masked etching process that forms the first, second and third trenches simultaneously.

Separately or in combination, the method further comprises providing an etch stop layer within the region of electrically insulating material, and wherein the masked etching process is performed by etching the region of electrically insulating material until each of the first, second and third trenches reach the etch stop layer.

Separately or in combination, the first metal layer comprises any one or more of: tungsten, tantalum, titanium, and platinum.

Separately or in combination, the method further comprises forming a strip of phase change material on the substrate, wherein the heating element is formed adjacent to the strip of phase change material such that the heating element is configured to control a conductive state of the strip of phase change material.

According to another embodiment, the method comprises providing a substrate, forming a region of electrically insulating material on the substrate, depositing a first metal layer on the of electrically insulating material, structuring the first metal layer to form first and second laterally isolated sections of the first metal layer, forming a central trench in the region of electrically insulating material in between the first and second laterally isolated sections of the first metal layer, forming a second metal region in central first trench, configuring the first and second isolated sections of the first metal layer to be first and second RF terminals of the phase change switching device, respectively, and configuring the second metal region to be a heating element of the phase change switching device that is configured to control a conductive connection between the first and second RF terminals, wherein the central trench is formed by a lithography process that self-aligns the central trench with the first and second laterally isolated sections of the first metal layer.

Separately or in combination, the lithography process comprises forming a hardmask layer over the first and second laterally isolated sections of the first metal layer, forming an opening in the hardmask layer that exposes inner ends of the first and second laterally isolated sections of the first metal layer; and etching the region of electrically insulating material through the opening to form the first trench.

Separately or in combination, the method further comprises depositing a dielectric layer after forming the central trench so as to cover the inner ends of the first and second laterally isolated sections with the dielectric layer, depositing a second metal layer in the central trench over the dielectric layer; and planarizing an upper surface of the second metal layer so as to remove sections of the second metal layer that are outside of the central trench, and wherein the second metal region is formed by the second metal layer.

Separately or in combination, structuring the first metal layer to form first and second laterally isolated sections of the first metal layer comprises forming first and second trenches in the region of electrically insulating material, depositing the first metal layer to fill the first and second trenches, and planarizing an upper surface of the first metal layer so as to form the first laterally isolated section of the first metal layer in the first trench, and form the second laterally isolated section of the first metal layer in the second trench.

Separately or in combination, the heating element has a different metal composition as the first and second RF terminals.

Separately or in combination, the method further comprises forming a strip of phase change material on the substrate, wherein the heating element is formed adjacent to the strip of phase change material such that the heating element is configured to control a conductive state of the strip of phase change material.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes

FIG. 4, which includes

FIG. 6, which includes

FIG. 8, which includes

DETAILED DESCRIPTION

Embodiments of a PCM (phase change material) switching device and corresponding methods of forming the phase change switching device are described herein. The PCM switching device comprises a strip of phase change material connected between first and second RF terminals, and a heating element disposed adjacent to the strip of phase change material. The heating element is configured to control a conductive connection between the first and second RF terminals by heating the strip of phase change material. Advantageously, the heating element is self-aligned to the first and second RF terminals. As a result, the device has less variation in performance parameters attributable to process variation, e.g., capacitance between the heating element and the RF terminals, thermal resistance between the heating element and the surrounding regions of the PCM switching device. Moreover, the self-aligned techniques for forming the heating element and the RF terminals advantageously eliminate costly lithography steps.

Figure 1:
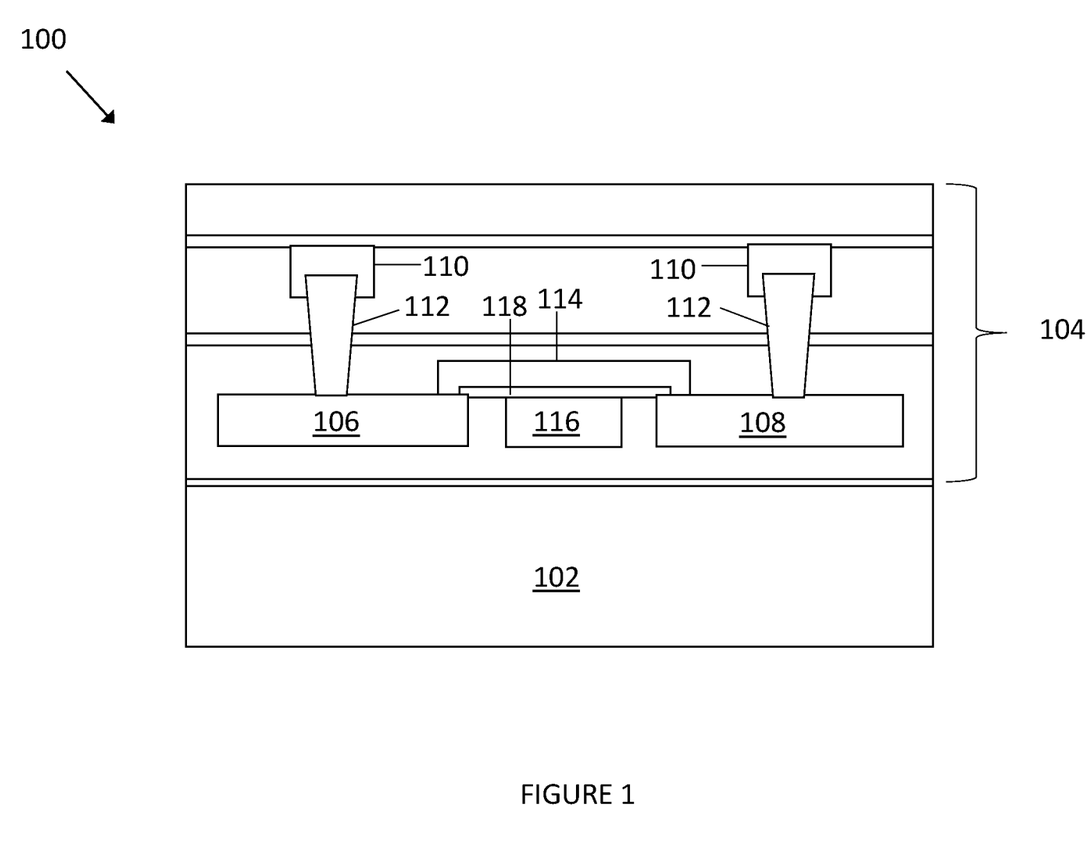
FIG. 1 illustrates a phase change switching device, according to an embodiment.

Referring to FIG. 1, a PCM switching device 100 is depicted, according to an embodiment. The PCM switching device 100 includes a substrate 102. Generally speaking, the substrate 102 may include any material that is compatible with semiconductor processing techniques, e.g., deposition, etching, etc. For example, the substrate 102 may include semiconductor materials such as silicon (Si), carbon, silicon carbide (SiC), silicon germanium (SiGe), etc. In another example, the substrate 102 includes non-semiconductor material, e.g., sapphire, glass, diamond, etc. In one particular embodiment, the substrate 102 is a commercially available bulk semiconductor wafer, e.g., a silicon wafer. In another example, the substrate 102 is a so-called SOI (Silicon on Insulator) substrate 102, which includes a buried layer of insulating material. The substrate 102 includes a main surface, which may be a substantially planar surface.

The PCM switching device 100 includes a region of electrically insulating material 104 that is formed on the main surface of the substrate 102. Generally speaking, the region of electrically insulating material 104 can comprise any electrically insulating material that can be formed through typical semiconductor processing techniques such as CVD (chemical vapor deposition). Examples of these electrically insulating materials include semiconductor oxides and nitrides, e.g., silicon nitride (SiN), silicon dioxide ($SiO_2$), silicon oxynitride ($SiO_xN_y$), etc. In another embodiment, the region of electrically insulating material 104 comprises aluminum nitride (AlN). The region of electrically insulating material 104 may be thermally insulating or thermally conductive. The region of electrically insulating material 104 may include multiple layers of the same or different material.

The PCM switching device 100 further includes first and second RF terminals 106, 108. The first and second RF terminals 106, 108 may be formed from an electrically conductive metal, e.g., copper, aluminum, alloys thereof, etc. As shown, the PCM switching device 100 may further comprise an upper level metallization 110 that is electrically connected to the first and second RF terminals 106, 108 by vertical through-via structures 112. The upper level metallization 110 can be a structured metallization e.g., copper, aluminum, alloys thereof, etc., and the vertical through-via structures 112 comprise a conductive metal such as tungsten, copper, nickel, aluminum, etc. The upper level metallization 110 may be connected to or form externally accessible terminals of the PCM switching device 100.

The PCM switching device 100 further includes a strip of phase change material 114. The strip of phase change material 114 may have an elongated geometry that extends lengthwise parallel to the main surface of the substrate 102. The strip of phase change material 114 is formed from a material that can be transitioned between two different phases that each have different electrical conductivity. For example, strip of phase change material 114 may comprise a material that changes from an amorphous state to a crystalline state based upon the application of heat to the phase change material, wherein the phase change material is electrically insulating (i.e., blocks a conductive connection) in the amorphous state and is electrically conductive (i.e., provides a low-resistance current path) in the crystalline state. Generally speaking, phase change materials having this property include chalcogenides and chalcogenide alloys. Specifically, these phase change materials include germanium-antimony-tellurium (GST), germanium-tellurium, and germanium-antimony.

The strip of phase change material 114 is connected between the first and second RF terminals 106, 108. That is, the strip of phase change material 114 is in low-ohmic contact with both the first and second RF terminals 106, 108, either through direct physical contact or by one or more conductive intermediaries that provide a low-resistance electrical connection. In one example, a conductive material such as TiN, W, TiPtAu is provided between the first and second RF terminals 106, 108 and the phase change material to improve the electrical connection between the two. When the strip of phase change material 114 is in a conductive state, current flows between the first and second RF terminals 106, 108 in a current flow direction of the strip of phase change material 114.

The PCM switching device 100 further includes at least one heating element 116. The heating element 116 is arranged adjacent to the strip of phase change material 114. In the depicted embodiment, the strip of phase change material 114 is disposed above each of the first and second RF terminals 106, 108 and the heating element 116. The heating element 116 is arranged and configured to apply heat to the strip of phase change material 114. For example, the heating element 116 may comprise a conductive or semiconductive material that converts electrical energy into heat through ohmic heating. The heating element 116 may be connected between electrically conductive heating terminals, which are not shown in the cross-sectional view of FIG. 1. For example, the heating element 116 may extend transversely to the current flow direction of the phase change material 114 and contact heating terminals that are in locations that are spaced apart from the cross-sectional plane of FIG. 1. The heating terminals are electrically conductive structures that can be biased to force a current through the heating element. The heating element 116 is separated from the strip of phase change material 114 by an insulating liner 118. The insulating liner 118 electrically isolates the heating element 116 from the strip of phase change material 114 while simultaneously permitting substantial heat transfer between the two. To this end, the insulating liner 118 may be a relatively thin (e.g., less than 1 μm thick and more typically less than 100 nm thick) layer of dielectric material, e.g., silicon dioxide ($SiO_2$), silicon nitride (SiN), etc.

The working principle of the PCM switching device 100 is as follows. The heating element 116 is configured to control a conductive connection between the first and second RF terminals 106, 108 by applying heat to the strip of phase change material 114. In an OFF state of the PCM switching device 100, the phase change material of the strip of phase change material 114 is in an amorphous state or partially amorphous. As a result, the strip of phase change material 114 blocks a voltage applied to the first and second RF terminals 106, 108. In an ON state of the PCM switching device 100, the phase change material of the strip of phase change material 114 is in a crystalline state. As a result, the strip of phase change material 114 provides a low-resistance electrical connection between the first and second RF terminals 106, 108. The PCM switching device 100 performs a switching operation by using the heating element 116 to heat the strip of phase change material 114. The phase change material may be transitioned to the amorphous state by applying a short pulses (e.g., pulses in the range of 50-1,000 nanoseconds) of high intensity heat which causes the phase change material to reach a melting temperature, e.g., in the range of 600° C. to 750° C., followed by a rapid cooling of the material. This is referred to as a "reset pulse." The phase change material may be transitioned to the crystalline state by applying longer duration pulses (e.g., pulses in the range of 0.5-10 microseconds) of lower intensity heat, which causes the phase change material to reach a temperature at which the material quickly crystallizes and is highly conductive, e.g., in the range of 250° C. to 350° C. This is referred to as a "set pulse."

According to an embodiment, the first and second RF terminals 106, 108 and the heating element 116 are formed by a lithography process that self-aligns the heating element 116 with the first and second RF terminals 106, 108. This means that one photomask and one lithography step form the first and second RF terminals 106, 108 and the heating element 116, either by directly forming these features or by forming features such as structured mask layers, trenches, etc. which in turn determine the geometry of the first and second RF terminals 106, 108 and the heating element 116. A lithography step utilizes a photomask has a pre-defined pattern that selectively blocks light to replicate the pre-defined pattern in a photosensitive material e.g., a photoresist layer, that is formed on a semiconductor substrate 102. This pattern is used to create the first and second RF terminals 106, 108 and the heating element 116 through a sequence of processing steps, e.g., etching, deposition, polishing, etc. In some of the processes described herein, the heating element 116 and the first and second RF terminals 106, 108 are formed simultaneously with one etching step. In other processes described herein, the first and second RF terminals 106, 108 are formed by an initial etching step, and the heating element 116 is subsequently formed by a second etching step that uses the first and second RF terminals 106, 108 as an etch mask. In either case, the first and second RF terminals 106, 108 and the heating element 116 are self-aligned because each feature owes its geometry to one lithography step.

The advantages of forming the first and second RF terminals 106, 108 and the heating element 116 according to a self-aligned technique include the following. The location of the heating element 116 relative to the first and second RF terminals 106, 108 may be well-controlled. For example, the heating element 116 may be centered between the first and second RF terminals 106, 108 to a great degree of precision. Separately or in combination, the spacing between the heating element 116 and the first and second RF terminals 106, 108 may be well-controlled to a great degree of precision. By contrast, in a device wherein the first and second RF terminals 106, 108 and the heating element 116 are not self-aligned (i.e., having a geometry defined by two different lithography steps), the location of the heating element 116 relative to the first and second RF terminals 106, 108 and/or the spacing between the heating element 116 and the first and second RF terminals 106, 108 is not as well-controlled, due to the possibility of mask misalignment. Even minor misalignment can have significant impact in device performance by altering the capacitive coupling between the heating element 116 and the first and second RF terminals 106, 108 and/or by altering the thermal resistance of the heating element 116 to the ambient environment. The self-aligned technique described herein substantially mitigates this issue by removing a potential source of unreliability in the manufacturing process. Moreover, the self-aligned technique advantageously eliminates costly lithography steps.

Referring to FIG. 2, selected process steps for forming the PCM switching device 100 of FIG. 1 are shown.

Figure 2A:
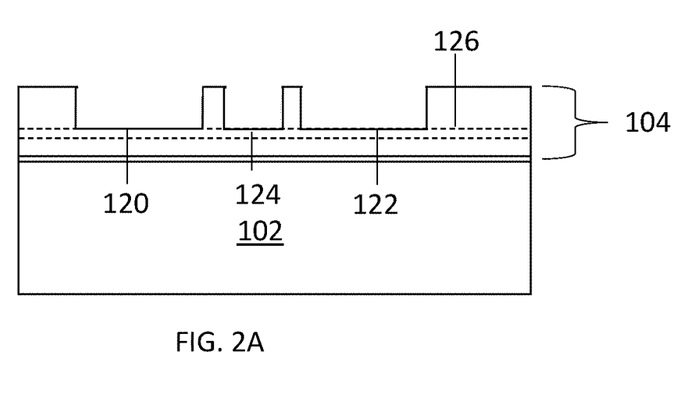
FIGS. 2A-2C, illustrates selected method steps for forming the phase change switching device illustrated in FIG. 1, according to an embodiment.

As shown in FIG. 2A, a substrate 102 is provided and a region of electrically insulating material 104 is formed on the main surface of the substrate 102. The region of electrically insulating material 104 can be formed by a deposition technique such as CVD (chemical vapor deposition) wherein one or more layers of electrically insulating material, e.g., silicon nitride (SiN), silicon dioxide ($SiO_2$), silicon oxynitride ($SiO_xN_y$), etc., are formed on the substrate 102. A first trench 120, a second trench 122, and a third trench 124 are formed in the region of electrically insulating material 104. The first, second and third trenches 120, 122, 124 may be formed by a lithography process that self-aligns the third trench 124 with the first and second trenches 120, 122. For example, a layer of photoresist material (not shown) may be provided on the region of electrically insulating material 104 and lithographically patterned using a photomask (not shown) to form openings in the layer of photoresist material. The patterned photomask can be used directly as an etch mask to form the first, second and third trenches 120, 122, 124. Alternatively, the patterned photomask can be used to form corresponding openings in a hardmask layer (not shown), which in turn is used to etch the first, second and third trenches 120, 122, 124. In either case, an etching process, e.g., chemical etch, reactive ion etching, plasma etching, etc., can be performed to etch the region of electrically insulating material 104. As a result, the first, second and third trenches 120, 122, 124 are formed to be self-aligned with one another.

According to an embodiment, an etch stop layer 126 is provided within the region of electrically insulating material 104. The etch stop layer 126 is less selective to the etchant that is used to form the first, second and third trenches 120, 122, 124 than the superjacent region of the electrically insulating material 104. For example, the etch stop layer 126 may include a nitride and/or a metal whereas the superjacent material includes an oxide. In this case, the masked etching process is performed by etching the region of electrically insulating material 104 until each of the first, second and third trenches 120, 122, 124 reach the etch stop layer 126. In this way, the depth of the first, second and third trenches 120, 122, 124 and hence the thickness of the functional elements of the PCM switching device 100 is well-controlled.

Figure 2B:
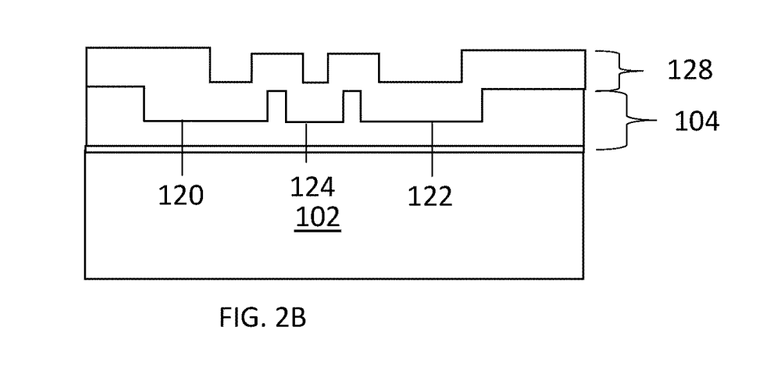

As shown in FIG. 2B, a first metal layer 128 is deposited on the region of electrically insulating material 104. The first metal layer 128 is conformably deposited so as to completely fill the first, second and third trenches 120, 122, 124. That is, a thickness of the first metal layer 128 is at least equal to the depth of the first, second and third trenches 120, 122, 124. Generally speaking, the first metal layer 128 can comprise any metal or metal alloy with sufficient material properties to perform the function of the heating element 116 as described above. Examples of these metals include tungsten, tantalum, titanium, platinum, and any alloy or combination thereof.

Figure 2C:
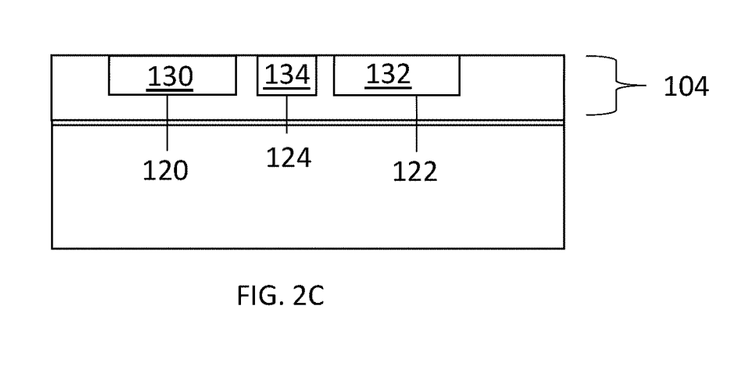

As shown in FIG. 2C, an upper surface of the first metal layer 128 is planarized. The planarization step can be performed using any technique that successively removes material from the upper surface of the first metal layer 128, e.g., polishing such as CMP (chemical-mechanical polishing). The planarization step removes all portions of the first metal layer 128 outside of the first, second and third trenches 120, 122, 124. As a result, first, second, and third sections 130, 132, 134 of the first metal layer 128 remain within the trenches. The first, second, and third sections 130, 132, 134 are laterally isolated from one another, meaning that there is no conductive path between each section.

Subsequent processing may be performed after the step illustrated in FIG. 2C to complete the PCM switching device 100. The strip of phase change material 114 and the insulating liner 118 may be formed by blanket deposition and subsequent masked etching step, for example. A further layer or layers of the electrically insulating material may be formed on top of the functional elements of the PCM switching device 100 by a deposition technique such as CVD (chemical vapor deposition), for example. The upper level metallization 110 and the through via 112 may be formed by etching and deposition techniques, for example. In the completed device, the first and second laterally isolated sections 130, 132 of the first metal layer 128 correspond to the first and second RF terminals 106, 108 of the PCM switching device 100, respectively, and the third laterally isolated section 134 of the first metal layer 128 corresponds to the heating element 116 of the PCM switching device 100.

Instead of the process illustrated with respect to FIGS. 2A-2C, alternate metal structuring techniques may be used to create the first, second, and third laterally isolated sections 130, 132, 134 of the first metal layer 128. For example, the first metal layer 128 may be deposited on a planar surface of electrically insulating material and subsequently structured using direct metal etching techniques, such as wet or dry etching techniques. In another example, the first, second, and third laterally isolated sections 130, 132, 134 of the first metal layer 128 may be formed by a lift-off technique. According to this technique, a structured layer of lift-off material is provided on a planar surface of the electrically insulating material. The first metal layer 128 is conformally deposited on the structured layer so as to fill the openings of the structured layer of lift-off material. The lift-off material is removed, e.g., by chemical dissolution such that the only portions of the first metal layer 128 disposed within openings remain. In each case, only one photomask is used to structure the first metal layer 128 and the first, second, and third laterally isolated sections 130, 132, 134 are self-aligned.

Figure 3:
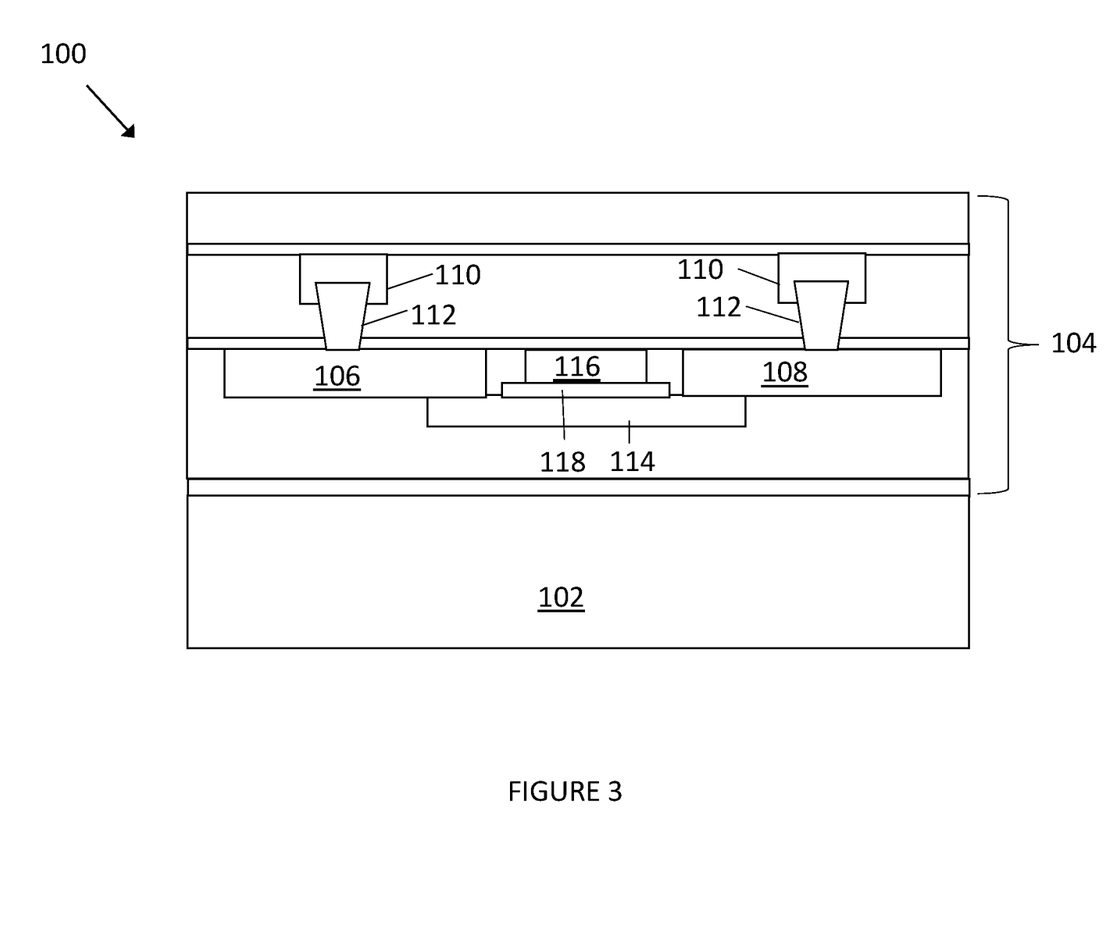
FIG. 3 illustrates a phase change switching device, according to an embodiment.

Referring to FIG. 3, a PCM switching device 100 is depicted, according to an embodiment. The PCM switching device 100 may be substantially identical to the PCM switching device 100 described with reference to FIG. 1, except that the strip of phase change material 114 is disposed below each of the first and second RF terminals 106, 108 and the heating element 116.

Referring to FIG. 4, selected process steps for forming the PCM switching device 100 of FIG. 3 are shown.

Figure 4A:
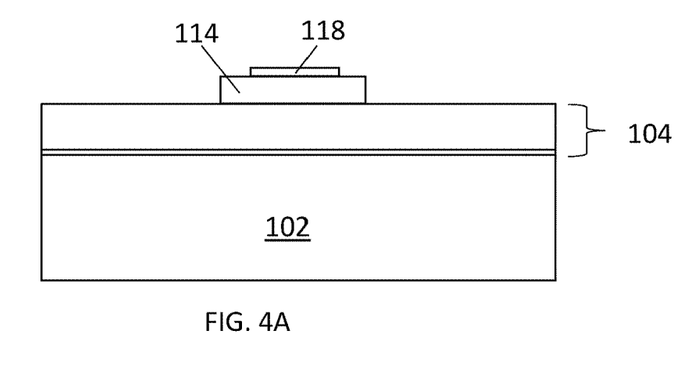
FIGS. 4A-4D, illustrates selected method steps for forming the phase change switching device illustrated in FIG. 3, according to an embodiment.

As shown in FIG. 4A, a substrate 102 is provided and a region of electrically insulating material 104 is formed on the main surface of the substrate 102. Subsequently, the strip of phase change material 114 and the insulating liner 118 are formed. This may be done by depositing a blanket layer of phase change material on the region of electrically insulating material 104 and subsequently structuring this blanket layer in a similar manner as previously described. The insulating liner 118 may be formed as a blanket layer and structured at the same time as the phase change material. Alternatively, the insulating liner 118 may be formed by a separate sequence of deposition and etching.

Figure 4B:
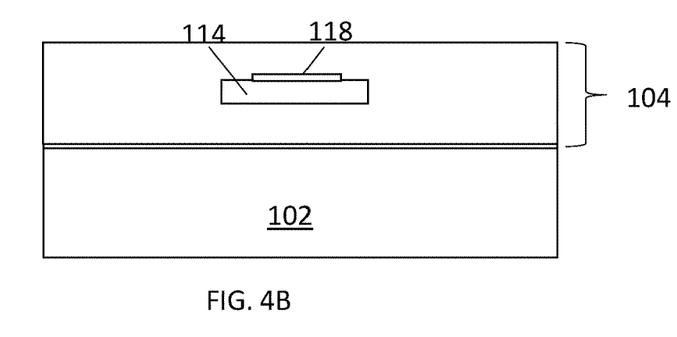

As shown in FIG. 4B, electrically insulating material is further deposited to grow the region of electrically insulating material 104. As a result, the strip of phase change material 114 and the insulating liner 118 are embedded within the region of electrically insulating material 104. A planarization step, e.g., polishing such as CMP (chemical-mechanical polishing) may be performed after the deposition of the electrically insulating material so as to planarize the upper surface of the electrically insulating material 104, thereby preparing this surface for the masked etching step described below.

Figure 4C:
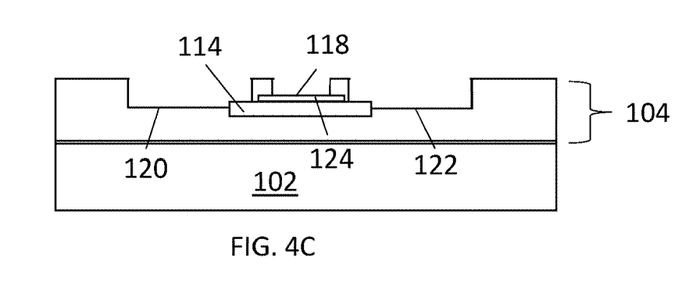

As shown in FIG. 4C, first, second and third trenches 120, 122, 124 are formed in region of the electrically insulating material. The first, second and third trenches 120, 122, 124 may be formed by a self-aligned masked etching technique, e.g., in the same manner as described with reference to FIG. 2B. The third trench 124 is formed to expose the insulating liner 118 and the first and second trenches 120, 122 is formed to expose the outer ends of the strip of phase change material 114.

Figure 4D:
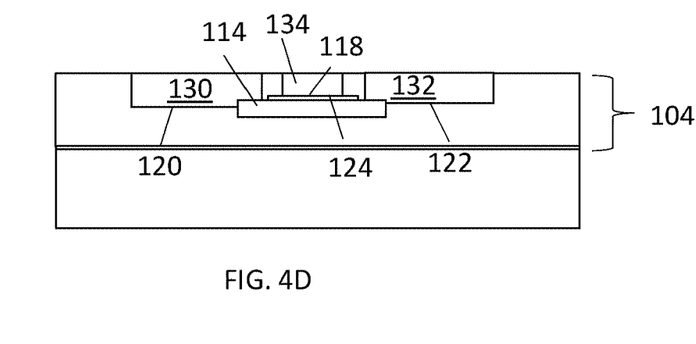

As shown in FIG. 4D, first, second, and third sections 130, 132, 134 of the first metal layer 128 are formed within the first, second and third trenches 120, 122, 124, respectively. This may be done by depositing a first metal layer 128 and subsequently planarizing the first metal layer 128 in a similar manner as described with reference to FIGS. 2B-2C. As a result, the functional elements of the PCM switching device 100 are formed. Subsequent processing may be performed after the step illustrated in FIG. 4D to complete the PCM switching device 100 in a similar manner as previously described.

Figure 5:
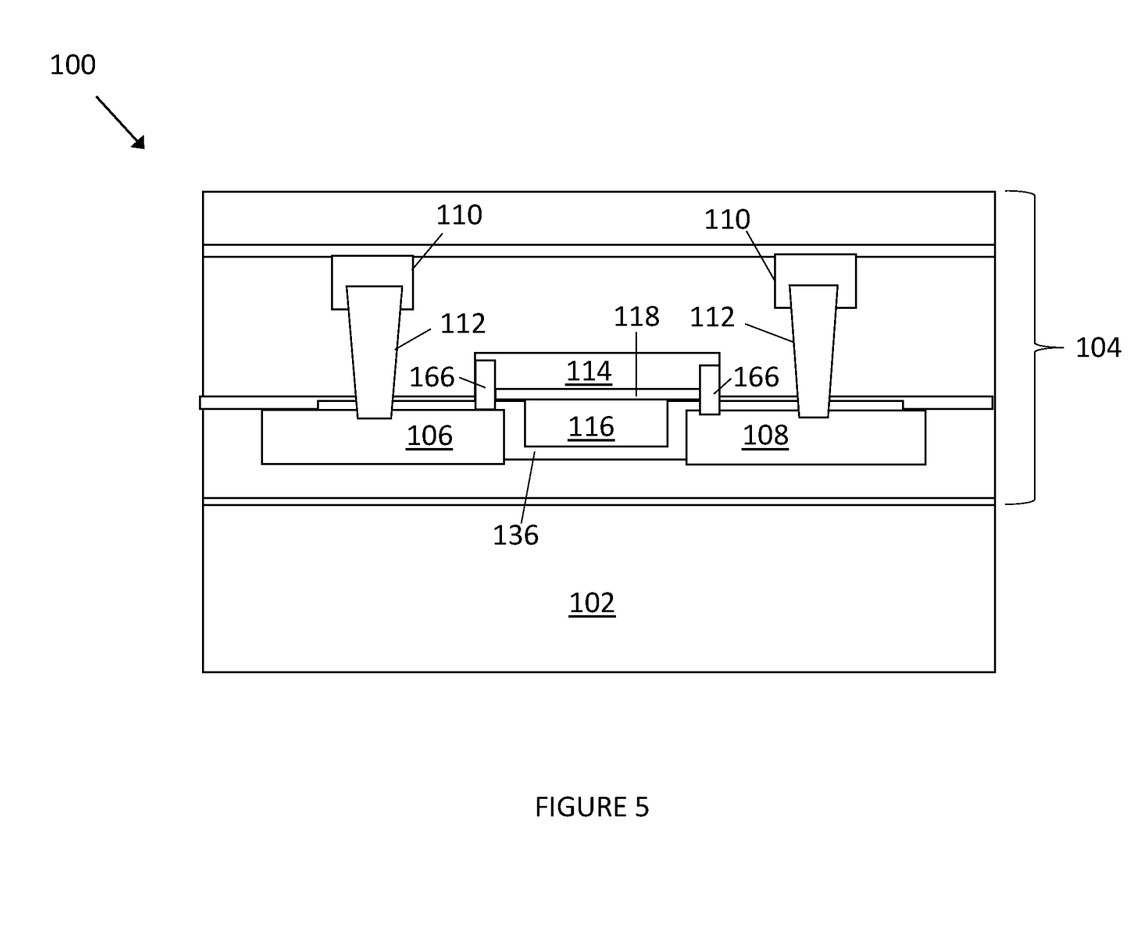
FIG. 5 illustrates a phase change switching device, according to an embodiment.

Referring to FIG. 5, a PCM switching device 100 is depicted, according to an embodiment. The PCM switching device 100 differs from the previously described embodiments in the following way. In the previously described embodiments, each of the first and second RF terminals 106, 108 and the heating element 116 are formed by the first metal layer 128, and hence have the same metal composition. By contrast, in the PCM switching device 100 of FIG. 5, the heating element 116 has a different metal composition as the first and second RF terminals 106, 108. For example, the first and second RF terminals 106, 108 may be formed from a first metal or metal alloy with preferable electrically conductive characteristics, e.g., copper, aluminum, alloys thereof. The heating element 116 may be formed from a second metal or metal alloy that is different from the first metal or metal alloy and has preferable heating characteristics, e.g., tantalum, tungsten, nickel, etc. and alloys thereof. In this way, there is no tradeoff between the preferable characteristics for the heating element 116 and the preferable characteristics for the first and second RF terminals 106, 108. Additionally, the PCM switching device 100 comprises a dielectric layer 136 that separates the first and second RF terminals 106, 108 and the heating element 116. The thickness of the dielectric layer 136 can be well-controlled according to the deposition technique described below such that advantageous control over the lateral positioning of the heating element 116 is maintained.

Referring to FIG. 6, selected process steps for forming the PCM switching device 100 of FIG. 5 are shown.

Figure 6A:
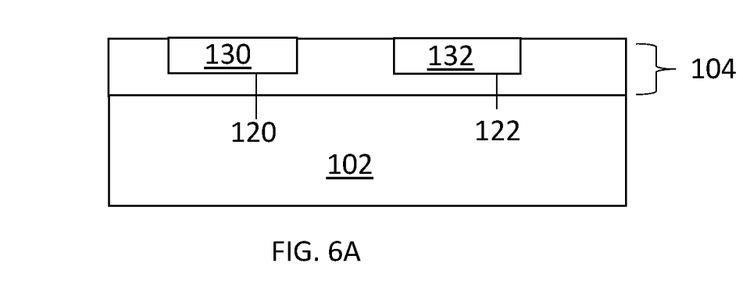
FIGS. 6A-6E, illustrates selected method steps for forming the phase change switching device illustrated in FIG. 5, according to an embodiment.

As shown in FIG. 6A, a substrate 102 is provided and a region of electrically insulating material 104 is formed on the main surface of the substrate 102. First and second laterally isolated sections 130, 132 of a first metal layer 128 are formed in the region of electrically insulating material 104, e.g., using the same technique described with reference to FIGS. 2A-2C. The first metal layer 128 used to form the first and second laterally isolated sections 130, 132 may comprise a first metal or metal alloy with preferable conductive characteristics, e.g., copper, aluminum, alloys thereof.

Figure 6B:
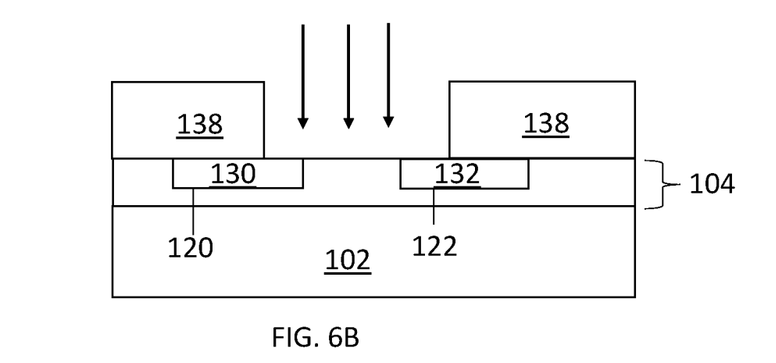

As shown in FIG. 6B, a hardmask layer 138 is formed over the first and second laterally isolated sections of the first metal layer 128. The thickness and material composition of the hardmask layer 138 are such that the hardmask layer 138 prevents the first and second laterally isolated sections 130, 132 from being etched during the subsequent etching process to be described below. The hardmask layer 138 is structured, e.g., using a lithographic patterning technique, to form an opening that exposes inner ends of first and second laterally isolated sections 130, 132. Subsequently, an etching process (e.g., wet chemical etch, reactive ion etching, plasma etching, etc.) is performed to remove the electrically insulating material through the opening in the hardmask layer 138. During this etching step, the first and second laterally isolated sections 130, 132, which correspond to the first and second RF terminals 106, 108 of the PCM switching device 100, are used as an etch mask to form a central trench 140 (shown in FIG. 6C) in between the first and second laterally isolated sections 130, 132. The central trench 140 is thus self-aligned to the first and second laterally isolated sections 130, 132 of the first metal layer 128, as the geometry of the central trench 140 is directly defined by the first and second RF terminals 106, 108, and the geometry of each structures is attributable to a single photomask.

Figure 6C:
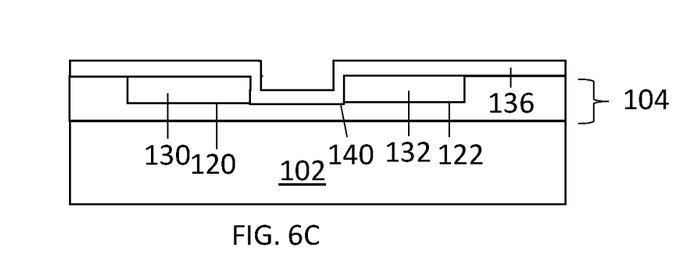

As shown in FIG. 6C, a dielectric layer 136 is deposited within the central trench 140 such that the dielectric layer 136 covers the inner ends of the first and second laterally isolated sections 130, 132. The dielectric layer 136 may be a relatively thin (e.g., less than 1 μm thick and more typically less than 100 nm thick) layer of dielectric material, e.g., silicon dioxide ($SiO_2$), silicon nitride (SiN), etc.

Figure 6D:
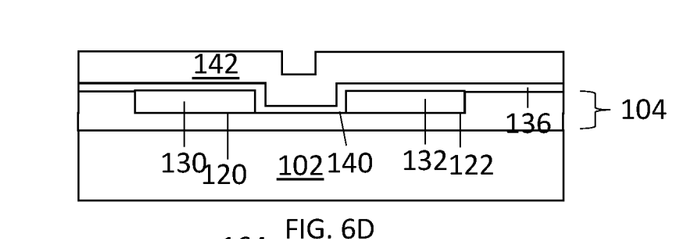

As shown in FIG. 6D, a second metal layer 142 is deposited in the central trench 140 over the dielectric layer 136. The second metal layer 142 may be conformally deposited with sufficient thickness to completely fill the central trench 140. The second metal layer 142 may comprise a second metal or metal alloy with preferable heating characteristics, e.g., tantalum, tungsten, nickel, etc. and alloys thereof.

Figure 6E:
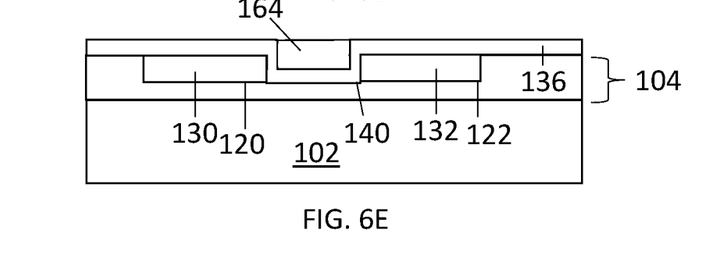

As shown in FIG. 6E, an upper surface of the second metal layer 142 is planarized so as to remove sections of the second metal layer 142 that are outside of the central trench 140. The planarization step can be performed using any technique that successively removes material from the upper surface of the second metal layer 142, e.g., polishing such as CMP (chemical-mechanical polishing). As a result, a second metal region 164 is formed in the central trench 140, wherein the second metal region 164 has a different material composition as the first and second laterally isolated sections 130, 132.

After performing the above-described steps, the second metal region 164 can be configured as the heating element 116 of the PCM switching device 100 described with reference to FIG. 6, and the first and second laterally isolated sections 130, 132 of the first metal layer 128 can be configured as the first and second RF terminals 106, 108 of the PCM switching device 100 according to previously describe techniques. For example, the insulating liner 118 and the strip of phase change material 114 may be formed on top of the second metal region 164 by masked etching techniques. As illustrated in FIG. 5, a via 166 may be formed that extends through the dielectric layer 136 so as to complete the electrical connection between the strip of phase change material 114 and the first and second RF terminals 106, 108.

Figure 7:
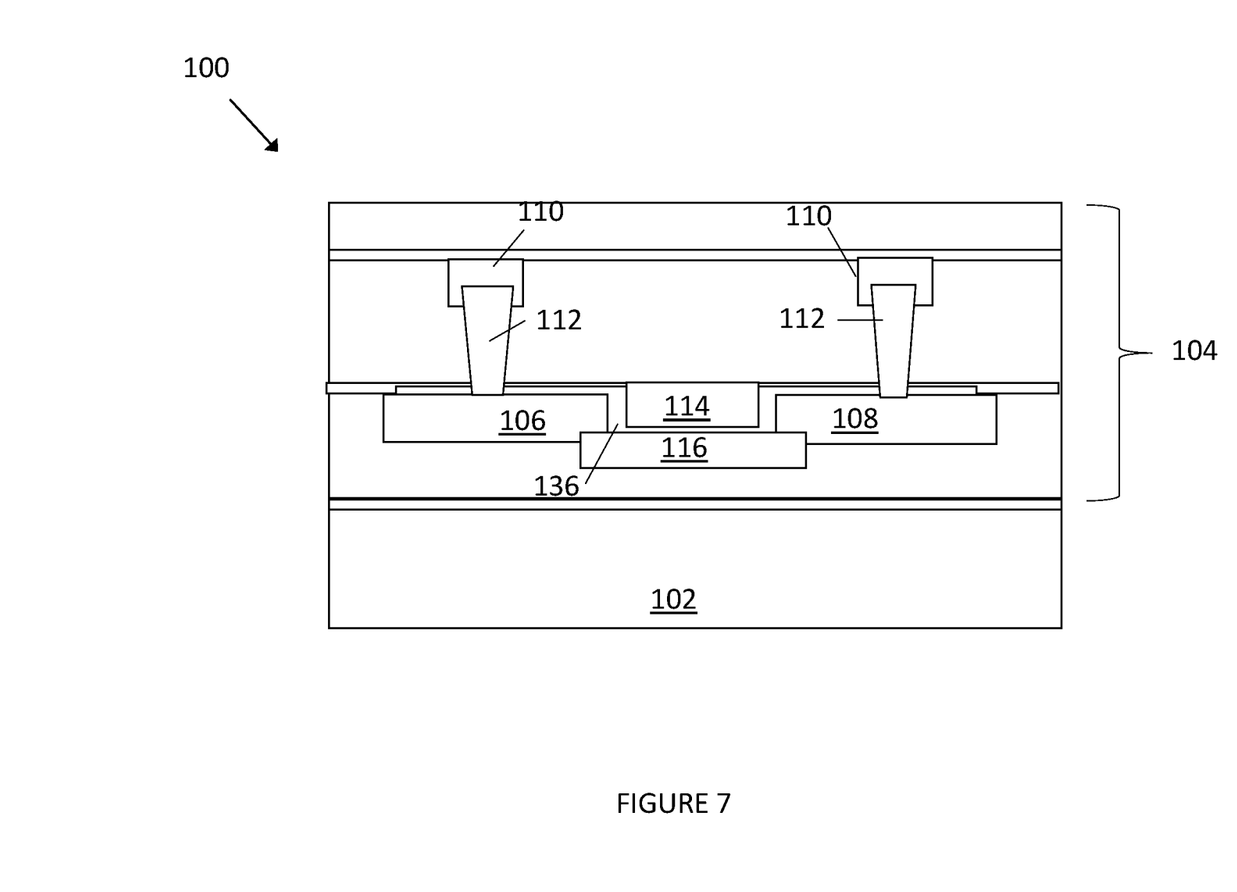
FIG. 7 illustrates a phase change switching device, according to an embodiment.

Referring to FIG. 7, a PCM switching device 100 is depicted, according to an embodiment. The PCM switching device 100 may be substantially identical to the PCM switching device 100 described with reference to FIG. 5, except that the strip of phase change material 114 is disposed below each of the first and second RF terminals 106, 108 and the heating element 116. In this case, the dielectric layer 136 provides the electrical isolation between the strip of phase change material 114 and the heating element 116 in a similar manner as the previously described insulating liner 118.

Referring to FIG. 8, selected process steps for forming the PCM switching device 100 of FIG. 7 are shown.

Figure 8A:
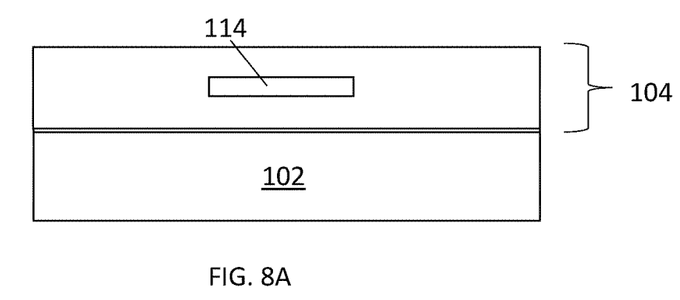
FIGS. 8A-8E, illustrates selected method steps for forming the phase change switching device illustrated in FIG. 7, according to an embodiment.

As shown in FIG. 8A, a substrate 102 is provided and a region of electrically insulating material 104 is formed on the main surface of the substrate 102. A strip of phase change material 114 is formed to be embedded within the region of electrically insulating material 104, e.g., in a similar manner as previously described with reference to FIG. 4B. A planarization step, e.g., polishing such as CMP (chemical-mechanical polishing) may be performed after the deposition of the electrically insulating material so as to form a planar upper surface in the region of electrically insulating material 104, thereby preparing this surface for the masked etching step described below.

Figure 8B:
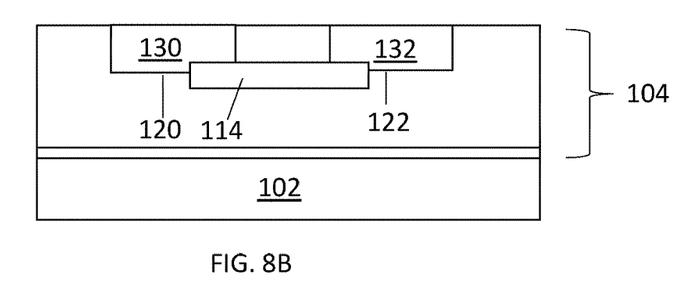

As shown FIG. 8B, first and second laterally isolated sections 130, 132 of a first metal layer 128 are formed in the region of electrically insulating material 104. The first and second laterally isolated sections 130, 132 may be formed by forming first and second trenches 120, 122 in the region of electrically insulating material 104, depositing the first metal layer 128 to fill the first and second trenches 120, 122, and planarizing an upper surface of the first metal layer 128, e.g., in a similar manner as previously described with reference to FIG. 6A.

Figure 8C:
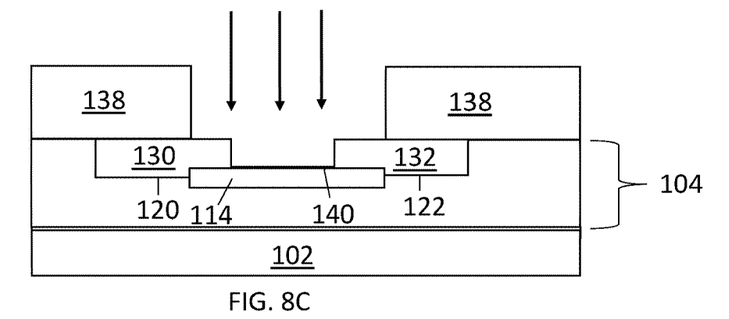

As shown in FIG. 8C, a hardmask layer 138 is formed over the first and second laterally isolated sections 130, 132 of the first metal layer 128, an opening is formed in the hardmask layer 138 that exposes inner ends of the first and second laterally isolated sections 130, 132 of the first metal layer 128, and the region of electrically insulating material 104 is etched through the opening to form the central trench 140, e.g., in a similar manner as previously described with reference to FIG. 6B.

Figure 8D:
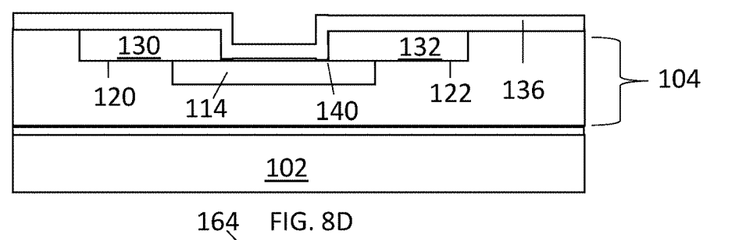

As shown in FIG. 8D, a dielectric layer 136 is deposited within the central trench 140 such that the dielectric layer 136 covers the inner ends of the first and second laterally isolated sections 130, 132, e.g., in a similar manner as previously described with reference to FIG. 6C.

Figure 8E:
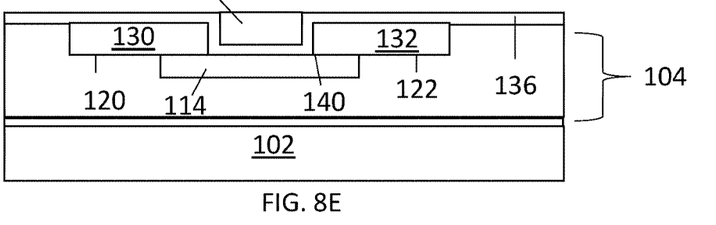

As shown in FIG. 8E, a second metal region 164 is formed in the central trench 140 over the dielectric layer 136, e.g., in a similar manner as previously described with reference to FIGS. 6D-6E.

The methods and structures disclosed herein with reference to specific figures are equally applicable to all other embodiments to the extent consistent with these other embodiments. For instance, particular techniques, materials, steps and so-forth describing a method of forming a device represented by one figure may be applied to any other method represented by other figures, to the extent consistent with these other methods. Likewise, particular device features, structures or arrangements disclosed in connection with a device represented by one figure may be incorporated into a device represented any other figures, to the extent consistent with these other devices.

The term "electrically connected," "directly electrically connected" and the like as used herein describes a permanent low-impedance connection between electrically connected elements, for example a direct contact between the relevant elements or a low-impedance connection via a metal and/or a highly doped semiconductor.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a phase change switching device, the method comprising:
   providing a substrate;
   forming first and second RF terminals on the substrate;
   forming a strip of phase change material on the substrate that is connected between the first and second RF terminals; and
   forming a heating element adjacent to the strip of phase change material such that the heating element is configured to control a conductive state of the strip of phase change material,
   wherein the first and second RF terminals and the heating element are formed by a lithography process that self-aligns the heating element with the first and second RF terminals.

2. The method of claim 1, further comprising:
   forming a region of electrically insulating material on the substrate; and
   forming a first trench and a second trench in the region of electrically insulating material by the lithography process,
   wherein the first and second RF terminals are formed in the first and second trenches, respectively.

3. The method of claim 2, further comprising:
   forming a third trench in the region of electrically insulating material by the lithography process, and
   wherein the heating element is formed in the third trench.

4. The method of claim 3, wherein the first, second and third trenches are each formed simultaneously by a single masked etching step.

5. The method of claim 3, wherein the first and second RF terminals are formed in the first and second trenches, respectively, before forming the third trench, and wherein forming the third trench comprises using the first and second RF terminals as an etch mask.

6. The method of claim 5, wherein the heating element has a different metal composition as the first and second RF terminals.

7. The method of claim 1, wherein the heating element is disposed below the strip of phase change material.

8. The method of claim 1, wherein the heating element is disposed above the strip of phase change material.

9. A method of forming a phase change switching device, the method comprising:
providing a substrate;
forming a region of electrically insulating material on the substrate;
depositing a first metal layer on the region of electrically insulating material;
structuring the first metal layer to form first, second and third laterally isolated sections of the first metal layer; and
configuring the first, second and third laterally isolated sections of the first metal layer such that the first and second laterally isolated sections are first and second RF terminals of the phase change switching device, respectively, and such that the third laterally isolated section is a heating element of the phase change switching device.

10. The method of claim 9, wherein structuring the first metal layer comprises:
forming first, second and third trenches in the region of electrically insulating material;
depositing the first metal layer on the region of electrically insulating material to fill the first, second and third trenches; and
planarizing an upper surface of the first metal layer so as to form the first, second and third laterally isolated sections of the first metal layer,
wherein the first, second and third trenches are formed by a lithography process that self-aligns the third trench with the first and second trenches.

11. The method of claim 10, wherein forming first, second and third trenches comprises performing a masked etching process that forms the first, second and third trenches simultaneously.

12. The method of claim 11, further comprising providing an etch stop layer within the region of electrically insulating material, and wherein the masked etching process is performed by etching the region of electrically insulating material until each of the first, second and third trenches reach the etch stop layer.

13. The method of claim 9, wherein the first metal layer comprises any one or more of:
tungsten, tantalum, titanium, and platinum.

14. The method of claim 9, further comprising forming a strip of phase change material on the substrate, wherein the heating element is formed adjacent to the strip of phase change material such that the heating element is configured to control a conductive state of the strip of phase change material.

15. A method of forming a phase change switching device, the method comprising:
providing a substrate;
forming a region of electrically insulating material on the substrate;
depositing a first metal layer on the of electrically insulating material;
structuring the first metal layer to form first and second laterally isolated sections of the first metal layer;
forming a central trench in the region of electrically insulating material in between the first and second laterally isolated sections of the first metal layer;
forming a second metal region in central first trench;
configuring the first and second isolated sections of the first metal layer to be first and second RF terminals of the phase change switching device, respectively, and
configuring the second metal region to be a heating element of the phase change switching device that is configured to control a conductive connection between the first and second RF terminals,
wherein the central trench is formed by a lithography process that self-aligns the central trench with the first and second laterally isolated sections of the first metal layer.

16. The method of claim 15, wherein the lithography process comprises:
forming a hardmask layer over the first and second laterally isolated sections of the first metal layer;
forming an opening in the hardmask layer that exposes inner ends of the first and second laterally isolated sections of the first metal layer; and
etching the region of electrically insulating material through the opening to form the first trench.

17. The method of claim 16, further comprising:
depositing a dielectric layer after forming the central trench so as to cover the inner ends of the first and second laterally isolated sections with the dielectric layer;
depositing a second metal layer in the central trench over the dielectric layer; and
planarizing an upper surface of the second metal layer so as to remove sections of the second metal layer that are outside of the central trench, and
wherein the second metal region is formed by the second metal layer.

18. The method of claim 15, wherein structuring the first metal layer to form first and second laterally isolated sections of the first metal layer comprises:
forming first and second trenches in the region of electrically insulating material;
depositing the first metal layer to fill the first and second trenches; and
planarizing an upper surface of the first metal layer so as to form the first laterally isolated section of the first metal layer in the first trench, and form the second laterally isolated section of the first metal layer in the second trench.

19. The method of claim 15, wherein the heating element has a different metal composition as the first and second RF terminals.

20. The method of claim 15, further comprising forming a strip of phase change material on the substrate, wherein the heating element is formed adjacent to the strip of phase change material such that the heating element is configured to control a conductive state of the strip of phase change material.

* * * * *

UNITED STATES PATENT AND TRADEMARK OFFICE
CERTIFICATE OF CORRECTION

PATENT NO. : 11,730,068 B2
APPLICATION NO. : 17/350398
DATED : August 15, 2023
INVENTOR(S) : D. Heiss et al.

Page 1 of 1

It is certified that error appears in the above-identified patent and that said Letters Patent is hereby corrected as shown below:

In the Claims

Column 14, Line 1 (Claim 15) please change "on the of" to -- on the --

Column 14, Line 8 (Claim 15) please change "in central first trench" to -- in the central trench --

Signed and Sealed this
Twenty-sixth Day of September, 2023

Katherine Kelly Vidal
*Director of the United States Patent and Trademark Office*